United States Patent
Hahn et al.

(10) Patent No.: US 10,550,998 B2
(45) Date of Patent: Feb. 4, 2020

(54) SAFETY SWITCH

(71) Applicant: Euchner GmbH + Co. KG, Leinfelden-Echterdingen (DE)

(72) Inventors: Frederic Hahn, Hilden (DE); Gerd Zeiler, Leinfelden-Echterdingen (DE)

(73) Assignee: Euchner GmbH + Co. KG, Leinfelden-Echterdingen (DE)

(*) Notice: Subject to any disclaimer, the term of this patent is extended or adjusted under 35 U.S.C. 154(b) by 152 days.

(21) Appl. No.: 15/896,095

(22) Filed: Feb. 14, 2018

(65) Prior Publication Data

US 2018/0238490 A1 Aug. 23, 2018

(30) Foreign Application Priority Data

Feb. 22, 2017 (EP) ..................................... 17157287

(51) Int. Cl.
*F16P 3/10* (2006.01)
*H03K 17/95* (2006.01)
*E05B 47/00* (2006.01)

(52) U.S. Cl.
CPC ............ *F16P 3/10* (2013.01); *H03K 17/9502* (2013.01); *H03K 17/9512* (2013.01); *H03K 17/9537* (2013.01); *E05B 2047/0068* (2013.01); *E05B 2047/0069* (2013.01); *E05B 2047/0086* (2013.01); *H03K 2217/958* (2013.01)

(58) Field of Classification Search
CPC ... F16P 3/10; H03K 17/9537; H03K 17/9512; H03K 2217/958; E05B 2047/0068; E05B 2047/0086
See application file for complete search history.

(56) References Cited

U.S. PATENT DOCUMENTS

| | | | | |
|---|---|---|---|---|
| 2006/0181417 A1* | 8/2006 | Pullmann | ........... | H03K 17/9502 340/545.2 |
| 2006/0214515 A1* | 9/2006 | Pullmann | ........... | H03K 17/9502 307/326 |
| 2014/0043161 A1* | 2/2014 | Santini | ................... | A22B 5/166 340/568.1 |
| 2015/0280424 A1* | 10/2015 | Leimbach | ............ | A61B 17/068 361/18 |

FOREIGN PATENT DOCUMENTS

EP EP-0111753 A2 * 6/1984 ............ B61L 25/043

OTHER PUBLICATIONS

Machine translation of EP 0111753 A2; Gotting, Hans-Heinrich; Jun. 1984 (Year: 1984).*

* cited by examiner

*Primary Examiner* — Jared Fureman
*Assistant Examiner* — Duc M Pham
(74) *Attorney, Agent, or Firm* — Michael Soderman

(57) ABSTRACT

A safety switch (1) having a reading head (2) and an actuator (3) having a transponder (4) and being movable relative to the reading head (2). Encoded signals of the transponder (4) are detectable by means of the reading head (2). As a means for detecting encoded signals, the reading head (2) has a resonant circuit (6) controlled by a processor unit, with the distance between the actuator (3) and reading head (2) being determined by means of an amplitude evaluation of the signals of the transponder (4) detected with the resonant circuit (6). Control signals are generated as a function of the distance signals thus determined.

12 Claims, 2 Drawing Sheets

SAFETY SWITCH

CROSS REFERENCE TO RELATED APPLICATIONS

This application claims the priority of EP 17157287.8 filed on Feb. 22, 2017; this application is incorporated by reference herein in its entirety.

BACKGROUND

The invention concerns a safety switch pursuant to the preamble of claim 1.

Safety switches of this type are used in the area of safety technology, with said switches being used, in particular, for monitoring hazardous areas around machines and systems.

The safety switch generates a switching signal that corresponds to the monitoring function of the switch, and the signal is sent to a controller used, e.g. for controlling a machine that is to be monitored. If the safety switch detects a non-hazardous state, in particular, that a door to be monitored is closed, a switching signal having the "switched-on" switching state, corresponding to an active safety condition, i.e. a release signal, will be generated. If the controller receives this release signal from the safety switch, the controller can start the operation of the machine, or allow the machine to continue to operate. If, however, the safety switch detects a hazardous state, e.g. an open door, the safety switch will generate a switching signal having the "switched-off" switching state, corresponding to a non-active safety condition. In this case, the controller will switch the machine off in order to prevent hazardous conditions.

Known safety switches have a reading head and an actuator that is movable relative to the reading head, with a transponder being provided on the actuator. For the case that the safety switch is used to monitor a door, in particular a safety door serving as access to a hazardous area, the actuator will typically be arranged on the door. The reading head will then be located on a frame surrounding the door. With a safety switch that is thus embodied, a switching signal will be generated that corresponds to a non-hazardous state if the reading head receives encoded signals generated by the transponder. In the case of a door monitoring system, this will be the case when the door is closed and the transponder consequently is located at a small distance from the reading head. In addition, a safety switch embodied in such a manner is used to generate a switching signal corresponding to a hazardous state if the reading head does not receive any signals from the transponder. For a door monitoring system this will be the case if the door is open and the transponder is consequently located at a large distance from the reading head.

SUMMARY

The invention relates to a safety switch (1) having a reading head (2) and an actuator (3) having a transponder (4) and being movable relative to the reading head (2). Encoded signals of the transponder (4) are detectable by means of the reading head (2). As a means for detecting encoded signals, the reading head (2) has a resonant circuit (6) controlled by a processor unit, with the distance between the actuator (3) and reading head (2) being determined by means of an amplitude evaluation of the signals of the transponder (4) detected with the resonant circuit (6). Control signals are generated as a function of the distance signals thus determined.

DETAILED DESCRIPTION

The problem underlying the invention is to provide a safety switch with increased functionality.

For solving this problem, the features of claim 1 are provided. Advantageous embodiments and useful further embodiments are described in the dependent claims.

The invention concerns a safety switch having a reading head, and an actuator that is movable relative to the reading head and that is equipped with a transponder. Encoded transponder signals are detectable by means of the reading head. As a means for detecting encoded signals, the reading head has a resonant circuit controlled by a processor unit, with the distance between actuator and reading head being determined by an amplitude evaluation of the transponder signals detected by means of the resonant circuit. Control signals will be generated as a function of the distance signals detected in this manner.

A significant advantage of the safety switch pursuant to the invention is constituted by the fact that the control signals generated with said switch as a function of the detected distance signals can be specified and set precisely. This results in significantly increased functionality relative to known safety switches, because in the latter the control signals are specified in a fixed manner by means of the detection or non-detection of the code of the transponder signals in the reading head.

What is essential here is the fact that the amplitude evaluation of the transponder signals provides an unambiguous measurement for the distance between the transponder and the actuator, with the amplitude of the distance signal being smaller the greater the distance. The distance between actuator and reading head provides reliable information about whether or not a hazardous state exists. In particular, based on the distance signal it is possible to determine whether a door to be monitored is closed or not. In principle, this would allow the control signals to be deduced solely from the distance signals detected. In a particularly preferred manner, however, not only the distance signals but also the detection of the transponder code are used when generating control signals, thereby significantly increasing the functional reliability of the safety switch.

In the case that a single safety switch is used for monitoring a hazardous area, the control signals generated in the safety switch can form switching signals that the safety switch outputs directly and that are read into a controller that uses them to control, in particular to shut down or start up, a machine or system representing a hazard.

In the case that several safety switches, e.g. arranged in series, are used for monitoring a hazardous area, the control signals of all the safety switches will be "are logically combined" or "combined in mathematical formulas", with this switching signal then being output to the controller that then controls the machine or system representing a hazard.

Particularly advantageously, the control signals are configurable.

This configuration can, in particular, be achieved by a switch-on distance and a switch-off distance being specified in the processor unit as configurable values to which the detected distance signals are compared.

If the distance signal falls below the switch-on distance, a criterion for a non-hazardous state exists so that correspondingly, a switch-on control signal can be generated as a control signal that allows starting up a hazardous machine or system. If the distance signal exceeds the switch-off distance, however, a criterion for a hazardous state exists, so that correspondingly a switch-off control signal can be generated as a control signal that allows shutting down the hazardous machine or system.

Particularly advantageously, a switch-on control signal will be generated in the processor unit if the distance value of the distance signal is smaller than the switch-on distance, and if the transponder code has been detected.

In addition, a switch-off control signal will be generated in the processor unit if the distance value of the distance signal is greater than the switch-off distance, or if the transponder code has not been detected.

This results in a particularly high level of safety and reliability of the monitoring function of the safety switch. This is achieved in particular by the fact that a switch-on control signal for starting up a hazardous machine will only be generated if two safety conditions have been realized in an AND operation, namely if the detected distance is smaller than the switch-on control signal, and if the transponder code has been detected.

Due to the configurability of the switch-on distance and the switch-off distance, manufacturing tolerances can be compensated for in the manufacturing process, so that the safety switches are independent of such manufacturing tolerances.

In addition, the switch-on distances and the switch-off distances are also configurable according to client-specific requirements. Thus, different applications can be realized with a single safety switch, without any hardware or software modifications.

Finally, by means of suitable configuration, the switch-off distance can be configured such that it largely corresponds to a safe switch-off distance resulting from a fault analysis of the safety switch, which is advantageous with regard to the safety-technology requirements.

When the actuator is located at a sufficiently small distance from it, the reading head of the safety switch is used to detect the transponder code. The transponder signals have an amplitude modulation that corresponds to a code.

Advantageously, the amplitude modulation of the transponder signals is also used to evaluate the amplitude for determining the distance. In this case, the amplitude evaluation of the transponder signal is performed in such a way that its level of modulation is determined.

The modulation level is defined as the difference of consecutive maximums and minimums of the amplitude-modulated signal.

Pursuant to an advantageous embodiment of the invention, an excitation signal for exciting the resonant circuit is generated in the processor unit.

Using an excitation coil, the excitation signal generates an electromagnetic field that is influenced by the signal of a transponder located within the range of influence of the resonant circuit.

Thus, the processor unit takes on a central control function such that it is used to control the resonant circuit for reading in the transponder signals. Furthermore, the signal evaluation is also performed in the processor unit, with separate evaluation channels being advantageously provided in the processor unit for code detection on the one hand and for distance detection on the other.

Particularly advantageously, control signals for the resonant circuit are generated in the processor unit.

In particular, the control signals are used for monitoring the supply voltage of the resonant circuit in order to be able to diagnose changes in the latter. Generally, the control signals are used to ensure reproducible, controlled behaviour of the resonant circuit so that distortions of the measuring signals caused by changes in the resonant circuit can be largely excluded.

To meet the requirements for use in the sphere of safety technology, the processor unit has a redundant design.

In particular, the processor unit has two micro-controllers or two ASICs. Generally, the processor unit can also have a different number of micro-controllers or ASICs. Finally, the processor unit can also have a single-channel design.

Consequently, the control function and the signal analysis are realized in the micro-controller software.

Alternatively, hardware-oriented realizations in the form of ASICs or suchlike may also be provided.

Pursuant to an advantageous embodiment, the safety switch has a lock.

By means of such a lock, the actuator is secured to the reading head, i.e. held in a locked position. The lock can be embodied as a mechanical unit, or also as an electrical unit with an electromagnet or suchlike.

BRIEF DESCRIPTION OF THE DRAWINGS

Below, the invention is explained based on the drawings. They show the following.

DETAILED DESCRIPTION OF THE PREFERRED EMBODIMENTS

Figure 1:
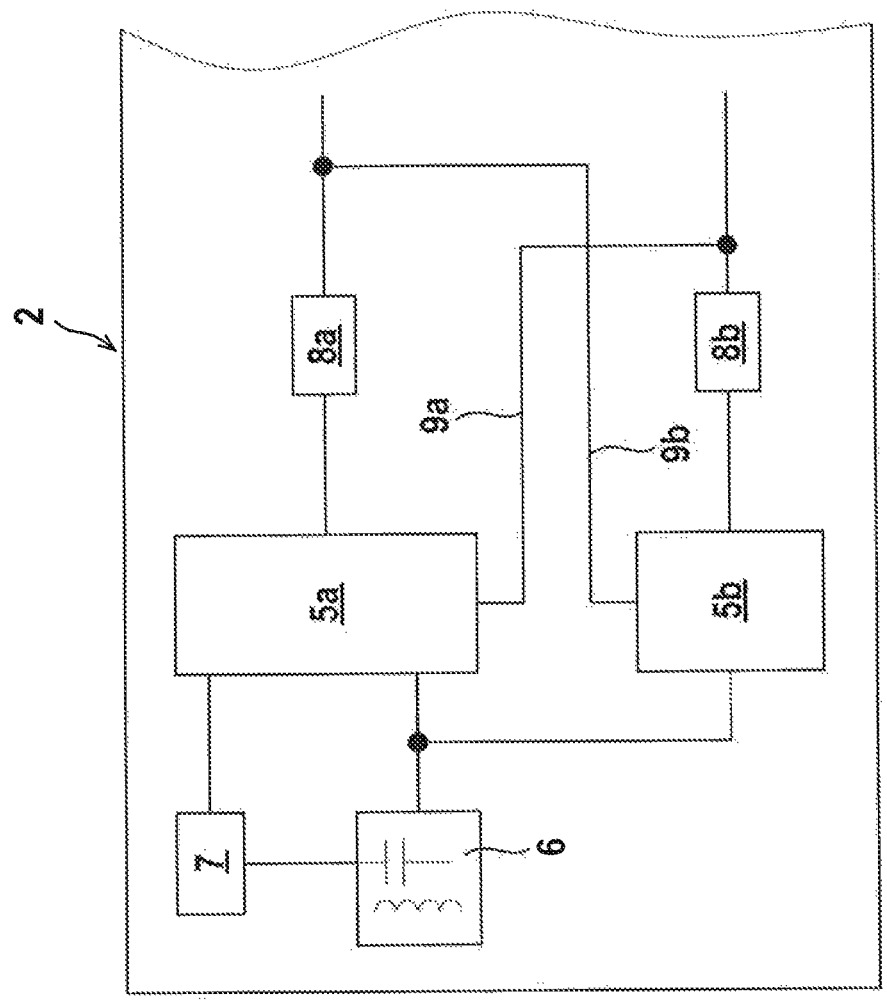
FIG. 1: Schematic representation of an exemplary embodiment of the safety switch pursuant to the invention.
Figure 1:
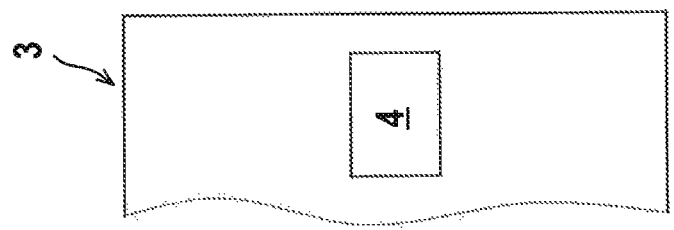

FIG. 1 is a schematic representation of the design of the safety switch 1 pursuant to the invention. Safety switch 1 can, in particular, be used for monitoring a door serving as access to a machine or system that may pose hazards for persons.

The safety switch 1 has a reading head 2 and an actuator 3. For door monitoring, the actuator 3 is typically located on the movable door, while the reading head 2 is mounted to a frame or suchlike in a stationary manner. When the door has been moved to its locked position, the actuator 3 rests in a receptacle (not shown) of the reading head 2 and is advantageously held there by a lock, which is also not shown.

As can be seen from FIG. 1, the actuator 3 has a transponder 4. The reading head 2 has a redundant processor unit with two micro-controllers 5a, 5b. In addition, the reading head 2 has a resonant circuit 6 that is controlled by one of the micro-controllers 5a via a driver circuit 7. The resonant circuit 6 can be used to detect signals of the transponder 4. The measuring signals of the resonant circuit 6 thus generated are directed to the two micro-controllers 5a, 5b preferably by means of decoupling circuits, which eliminate negative pulses in the measuring signals. As a function of the measuring signals of the resonant circuit 6, control signals, in the present case switching signals, are generated in the micro-controllers 5a, 5b, which control signals are directed to the outputs 8a, 8b. The switching signals at the outputs 8a, 8b are directed to a controller (not shown) that is used to control the machine or system to be monitored. The switching signals that are output via a micro-controller 5a, 5b to an output 8a, 8b are read back in each case into the other micro-controller 5b, 5a via a read-back line 9a, 9b for checking the function of these units.

The switching signals are designed to release the operation of the machine or system to be monitored only if no hazardous state exists, which is the case here if the door is closed and locked. Otherwise, the machine or system will be shut down by means of the switching signals.

The functionality of the safety switch 1 is such that an output signal, in particular, a pulse-width modulated signal, is output in the micro-controller 5a to the resonant circuit 6 via the driver circuit 7 The resonant circuit 6 excited in this manner generates an electromagnetic field in an excitation coil of the resonant circuit 6. In the near field, the strength of the electromagnetic field attenuates in inverse proportion to the square of the distance from the resonant circuit 6. If transponder 4 is located within the range of influence of the resonant circuit 6, energy will be coupled into a coil of the transponder 4 by the electromagnetic field of the excitation coil. If the energy in the transponder 4 is sufficient, the latter will send a stored code to the reading head 2 by means of the coil. The sending of the signal that is amplitude-modulated according to the code will be performed via load modulation. In this load modulation, energy is removed from the electromagnetic field by means of a short circuit. This change in the energy of the electromagnetic field is visible in the excitation coil of the resonant circuit 6, i.e. the signal which is amplitude-modulated according to the code of the transponder 4 is registered in resonant circuit 6. The field change is a direct function of the distance between the reading head 2 and the actuator 3, i.e. the amplitude-modulated signal of the transponder 4 registered in the resonant circuit 6 provides a direct measure for the distance between the reading head 2 and the transponder 4.

Figure 2:
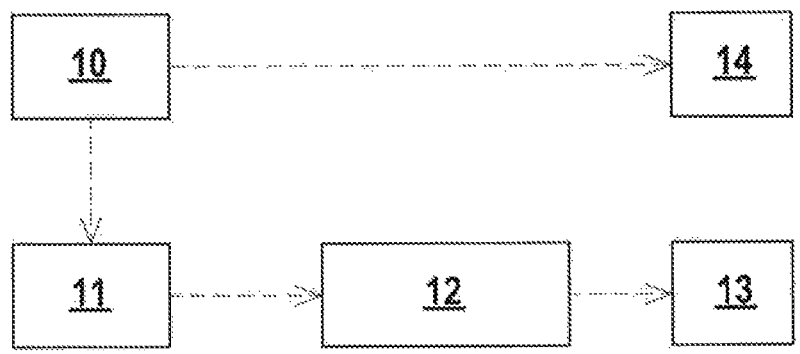
FIG. 2: Diagram of the signal evaluation implemented in the processor unit of the safety switch pursuant to FIG. 1.

In the micro-controllers 5, 5b detection of the code of transponder 4 and also distance determination both take place, based on the signals registered in the resonant circuit 6. The evaluation provided for this purpose in the software of the microcontrollers 5a, 5b is represented schematically in FIG. 2. A data recorder 10 reads in the signals of the resonant circuit 6. A first evaluation branch comprises a filter 11 for signal filtering, a decoding unit 12 for decoding the signal of the transponder 4 and a code evaluation unit 13 for evaluating the code.

A second evaluation branch comprises a distance detection unit 14. There, the distance between the actuator 3 and reading head 2 is determined by an amplitude evaluation of the signals of the transponder 4.

In the distance detection unit 14, a switch-on distance and a switch-off distance are specified as configurable parameters for evaluating the distance signals provided by the resonant circuit 6. The switch-on distance and the switch-off distance constitute threshold values to which the detected distance signals are compared, with the switch-on distance being smaller than the switch-off distance.

As a function of the signal evaluation results in the distance detection unit 14 and in the code evaluation unit 13, control signals are generated in the processor unit, which are output as switching signals to the controller via outputs 8a, 8b for controlling the machine or system to be monitored.

In the process, a switch-on control signal is generated as a control signal in the processor unit if the distance value of the distance signal is smaller than the switch-on distance and if the code of the transponder 4 is simultaneously detected in the code evaluation unit 13. If these conditions are met, it is reliably guaranteed that the door is closed, and thus that no hazardous state exists. As a result, the switch-on control signal is used for releasing the operation of the machine or system to be monitored.

The processor unit generates a switch-off control signal if the distance value of the distance signal is greater than the switch-off distance, or if the code of the transponder 4 is not detected. Because at least one of the conditions for a non-hazardous state, i.e. that the door is closed, thus does not exist, this is evaluated in the processor unit as a hazardous state so that the switch-off control signal is output as a switching signal to the controller with which the machine or system to be monitored is shut down.

LIST OF REFERENCE NUMERALS (1) Safety switch
(2) Reading head
(3) Actuator
(4) Transponder
(5a, 5b) Micro-controller
(6) Resonant circuit
(7) Driver circuit
(8a, 8b) Output
(9a, 9b) Read-back line
(10) Data recorder
(11) Filter
(12) Decoding unit
(13) Code evaluation unit
(14) Distance detection unit

The invention claimed is:

1. Safety switch (1) having a reading head (2) and an actuator (3) movable relative to reading head (2), said actuator (3) having a transponder (4), with encoded signals of transponder (4) being detectable by means of reading head (2), characterized in that the reading head (2) has a resonant circuit (6) as a means for detecting encoded signals, said resonant circuit (6) being controlled by a processor unit, with the distance between actuator (3) and reading head (2) being determined by amplitude evaluation of the signals of the transponder (4) detected by means of the resonant circuit (6), and with control signals being generated as a function of the distance signals thus determined, wherein a switch-on distance and a switch-off distance, to which distances the detected distance signals are compared, are specified in the processor unit as configurable variables.

2. Safety switch pursuant to claim 1, characterized in that a switch-on control signal will be generated in the processor unit if the distance value of the distance signal is smaller than the switch-on distance and if the code of the transponder (4) has been detected.

3. Safety switch pursuant to claim 1, characterized in that a switch-off control signal will be generated in the processor unit if the distance value of the distance signal is greater than the switch-off distance or if the code of the transponder (4) has not been detected.

4. Safety switch pursuant to claim 1, characterized in that the signals of the transponder (4) have amplitude modulation that corresponds to a code.

5. Safety switch pursuant to claim 4, characterized in that the amplitude evaluation of the signal of the transponder (4) is performed such that said signal's modulation level is determined.

6. Safety switch pursuant to claim 1, characterized in that an excitation signal is generated in the processor unit for excitation of the resonant circuit (6).

7. Safety switch pursuant to claim 6, characterized in that an electromagnetic field is generated by the excitation signal by means of an excitation coil, which electromagnetic field is influenced by the signal of a transponder (4) located within the range of influence of the resonant circuit (6).

8. Safety switch pursuant to claim 1, characterized in that control signals for the resonant circuit (6) are generated in the processor unit.

9. Safety switch pursuant to claim 1, characterized in that the signals generated in the resonant circuit (6) are directed to the processor unit via a decoupling circuit.

10. Safety switch pursuant to claim 1, characterized in that the processor unit has a redundant design.

11. Safety switch pursuant to claim 10, characterized in that the processor unit has two microcontrollers (5a, 5b) or two ASICs.

12. Safety switch pursuant to claim 1, characterized in that it has a lock.

* * * * *